United States Patent
Choi et al.

(10) Patent No.: US 7,931,846 B2
(45) Date of Patent: *Apr. 26, 2011

(54) METHOD TO CONTROL AN ATMOSPHERE BETWEEN A BODY AND A SUBSTRATE

(75) Inventors: Yeong-Jun Choi, Cedar Park, TX (US); Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/688,190

(22) Filed: Jan. 15, 2010

(65) Prior Publication Data

US 2010/0119637 A1    May 13, 2010

Related U.S. Application Data

(63) Continuation of application No. 11/231,580, filed on Sep. 21, 2005, now Pat. No. 7,670,534.

(51) Int. Cl.
*B28B 11/00* (2006.01)
*B41C 1/06* (2006.01)
*C23F 1/00* (2006.01)

(52) U.S. Cl. ........ 264/320; 264/293; 264/319; 425/406; 425/105; 425/385

(58) Field of Classification Search .............. 264/85, 264/293, 320; 425/406, 150, 385
See application file for complete search history.

(56) References Cited

U.S. PATENT DOCUMENTS

| | | | |
|---|---|---|---|
| 7,279,358 B2 * | 10/2007 | Yamauchi et al. | 438/108 |
| 7,316,554 B2 * | 1/2008 | Choi et al. | 425/210 |
| 7,329,114 B2 * | 2/2008 | Harper et al. | 425/385 |
| 7,670,534 B2 * | 3/2010 | Choi et al. | 264/320 |
| 2004/0046271 A1 * | 3/2004 | Watts | 264/1.25 |
| 2004/0118809 A1 * | 6/2004 | Chou et al. | 216/40 |
| 2004/0131718 A1 * | 7/2004 | Chou et al. | 425/385 |
| 2005/0064054 A1 * | 3/2005 | Kasumi | 425/112 |
| 2005/0072755 A1 * | 4/2005 | McMackin et al. | 216/44 |
| 2005/0155554 A1 * | 7/2005 | Saito | 118/719 |
| 2006/0077374 A1 * | 4/2006 | Sreenivasan et al. | 355/72 |
| 2007/0065532 A1 * | 3/2007 | Choi et al. | 425/375 |
| 2007/0114686 A1 * | 5/2007 | Choi et al. | 264/2.7 |
| 2007/0243279 A1 * | 10/2007 | McMackin et al. | 425/385 |

* cited by examiner

*Primary Examiner* — Joseph S Del Sole
*Assistant Examiner* — Nahida Sultana
(74) *Attorney, Agent, or Firm* — Laura C. Robinson

(57) ABSTRACT

Systems to control an atmosphere about a substrate are described. The systems include a wall coupled to the substrate to create a resistance of the flow between different regions of the substrate.

20 Claims, 3 Drawing Sheets

METHOD TO CONTROL AN ATMOSPHERE BETWEEN A BODY AND A SUBSTRATE

CROSS-REFERENCE TO RELATED PATENT APPLICATIONS

The present application is a continuation of U.S. Ser. No. 11/231,580 filed on Sep. 21, 2005, which is incorporated by reference herein in its entirety. U.S. Ser. No. 11/231,580 is related in subject matter to U.S. Pat. No. 7,316,554, which is incorporated by reference herein in its entirety.

BACKGROUND OF THE INVENTION

The field of the invention relates generally to micro-fabrication techniques. More particularly, the present invention is directed to a system of controlling an atmosphere between a mold and a substrate.

Nano-fabrication involves the fabrication of very small structures, e.g., having features on the order of nano-meters or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as U.S. patent application publication 2004/0065976 filed as U.S. patent application Ser. No. 10/264,960, entitled, "Method and a Mold to Arrange Features on a Substrate to Replicate Features having Minimal Dimensional Variability"; U.S. patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The fundamental imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

U.S. patent application publication 2005/0074512 filed as U.S. patent application Ser. No. 10/898,037 entitled "System for Creating a Turbulent Flow of Fluid between a Mold and a Substrate" describes a system for introducing a flow of a fluid between a mold and a substrate. More specifically, the system includes a baffle coupled to a chuck, the baffle having first and second apertures in communication with a fluid supply to create a turbulent flow of the fluid between the mold and the substrate.

To that end, it may be desired to provide an improved system of controlling the atmosphere between a mold and a substrate.

DETAILED DESCRIPTION OF THE INVENTION

Figure 1:
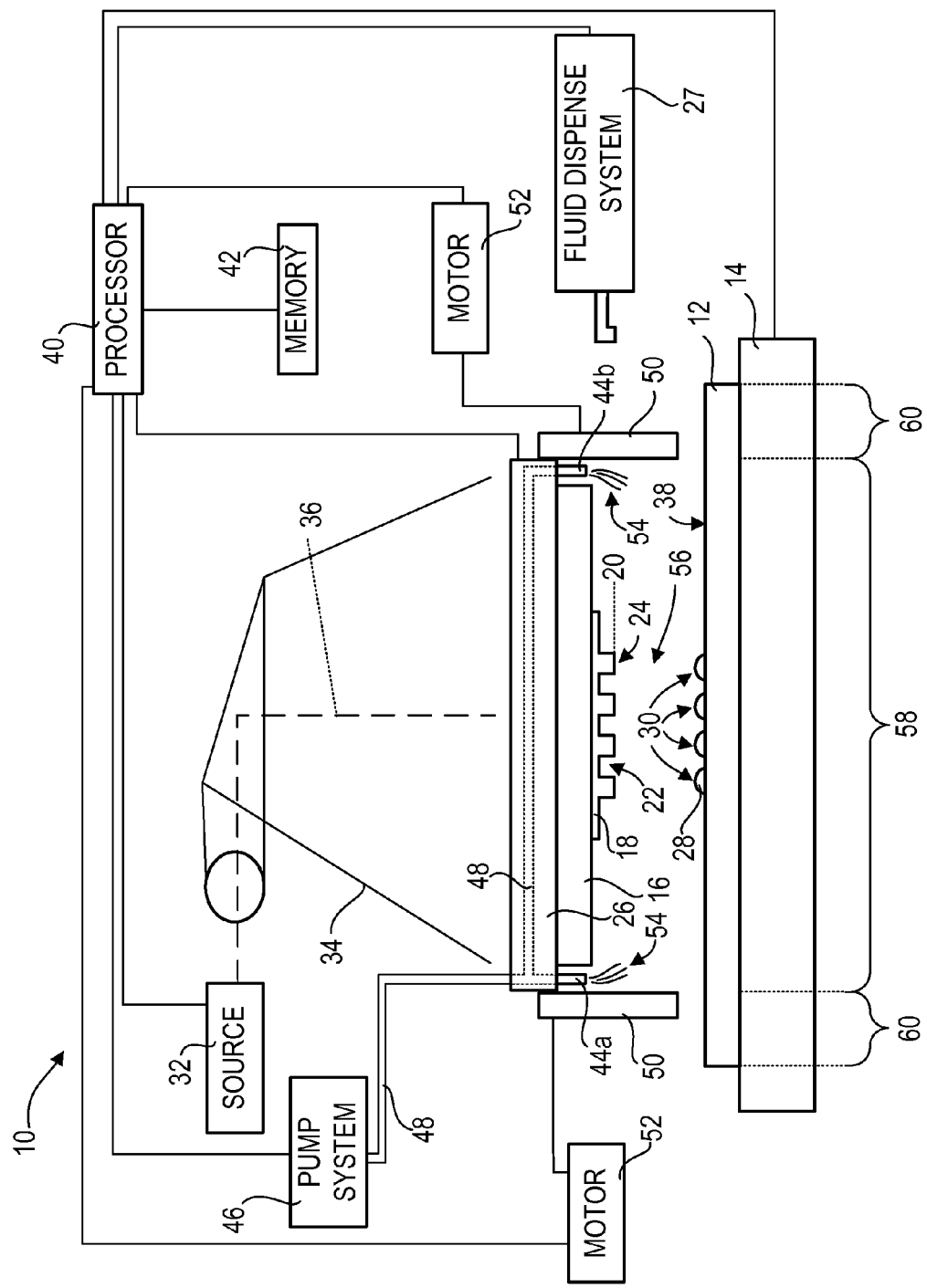
FIG. 1 is a simplified side view of a lithographic system having walls coupled to an imprint head.

A system 10 employed to form a relief pattern in a substrate 12 includes a stage 14 upon which substrate 12 is supported, and a template 16 having a mold 18 with a patterning surface 20 thereon. In a further embodiment, substrate 12 may be coupled to a substrate chuck (not shown), the substrate chuck (not shown) being any chuck including, but not limited to, vacuum and electromagnetic.

Template 16 and/or mold 18 may be formed from such materials including but not limited to, fused-silica, quartz, silicon, organic polymers, siloxane polymers, borosilicate glass, fluorocarbon polymers, metal, and hardened sapphire. As shown, patterning surface 20 comprises features defined by a plurality of spaced-apart recessions 22 and protrusions 24. However, in a further embodiment, patterning surface 20 may be substantially smooth and/or planar. The plurality of features of patterning surface 20 defines an original pattern that forms the basis of a pattern to be formed on substrate 12.

Template 16 may be coupled to an imprint head 26 to facilitate movement of template 16, and therefore, mold 18. In a further embodiment, template 16 may be coupled to a template chuck (not shown), the template chuck (not shown) being any chuck including, but not limited to, vacuum and electromagnetic. A fluid dispense system 27 is coupled to be selectively placed in fluid communication with substrate 12 so as to deposit a polymerizable material 28 thereon. It should be understood that polymerizable material 28 may be deposited using any known technique, e.g., spin-coating, dip coating, chemical vapor deposition (CVD), physical vapor deposition (PVD), and the like. In the present example, however, polymerizable material 28 is deposited as a plurality of spaced-apart discrete droplets 30 on substrate 12.

A source 32 of energy 34 is coupled to direct energy 34 along a path 36. Imprint head 26 and stage 14 are configured to arrange mold 18 and substrate 12, respectively, to be in superimposition, and disposed in path 36. Either imprint head 26, stage 14, or both vary a distance between mold 18 and substrate 12 to define a desired volume therebetween that is filled by polymerizable material 28.

Typically, polymerizable material 28 is disposed upon substrate 12 before the desired volume is defined between mold 18 and substrate 12. However, polymerizable material 28 may fill the volume after the desired volume has been obtained. After the desired volume is filled with polymerizable material 28, source 32 produces energy 34, which causes polymerizable material 28 to solidify and/or cross-link, forming a polymeric material conforming to the shape of a surface 38 of substrate 12 and patterning surface 20 of mold 18. Control of this process is regulated by processor 40 that is in data communication with stage 14, imprint head 26, fluid dispense system 27, and source 32, operating on a computer-readable program stored in memory 42.

System 10 further comprises a pair of conduits 44a and 44b. As shown, conduits 44a and 44b are coupled to imprint head 26; however, conduits 44a and 44b may be coupled to any part of system 10, i.e., substrate 12, stage 14, template 16, the substrate chuck (not shown), or the template chuck (not shown). Further, system 10 may comprise any number of conduits. Conduits 44a and 44b may be in fluid communication with a pump system 46 via throughways 48. As shown, throughways 48 are contained within imprint head 26. However, in a further embodiment, throughways 48 may be positioned anywhere throughout system 10 and may be coupled to any part of system 10, i.e., substrate 12, stage 14, template 16, the substrate chuck (not shown), or the template chuck (not shown). Pump system 46 may be in communication with processor 40 operating on memory 42 to control an introduction/evacuation of a fluid 54 in an atmosphere 56 defined between mold 18 and droplets 30, described further below.

Further, system 10 comprises walls 50 coupled to imprint head 26. In a further embodiment, walls 50 may be coupled to any part of system 10, i.e., substrate 12, stage 14, template 16, the substrate chuck (not shown), or the template chuck (not shown). Walls 50 may be positioned at an interface between first and second regions 58 and 60 of substrate 12, with first region 58 being in superimposition with mold 18 and droplets 30. Further, walls 50 may substantially surround imprint head 26, and therefore, atmosphere 56. However, for simplicity of illustration, walls 50 are shown surrounding a portion of imprint head 26 and atmosphere 56.

Walls 50 may be in communication with a motor 52, with motor 52 controlling a motion thereof. For simplicity of illustration, motor 52 is shown as two separate bodies. Motor 52 may comprise a solenoid selected from a group of solenoids including but not limited to, electric, pneumatic, and hydraulic. Further, motor 52 may be employed without feedback. Motor 52 may be in communication with processor 40 operating on memory 42.

As mentioned above, during imprinting, template 16 and therefore, mold 18, are brought into proximity with substrate 12 before positioning polymerizable material 28 in droplets 30 upon substrate 12. Specifically, template 16 is brought within hundreds of microns of substrate 12, e.g., approximately 200 microns. It has been found desirable to perform localized control of atmosphere 56 that is proximate to both template 16 and substrate 12. For example, to avoid the deleterious effects of gases and/or gas pockets present in polymerizable material 28 in droplets 30 and/or subsequently trapped in a patterned layer, described further below, formed from droplets 30, it has been found beneficial to control desired properties of atmosphere 56 and/or the pressure of atmosphere 56. More specifically, it may be desired to control fluid 54 within atmosphere 56. To that end, a system and a method to facilitate control of atmosphere 56 is described below.

Figure 2:
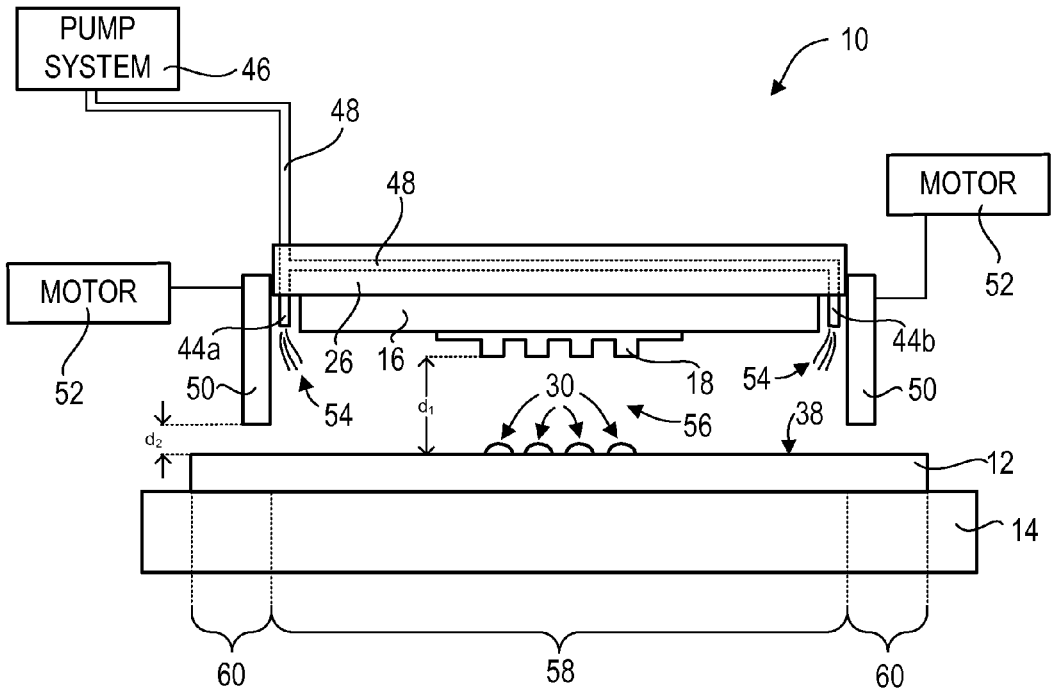
FIG. 2 is a side view of a portion of the system shown in FIG. 1, with the walls placed in a first position.

Referring to FIG. 2, a portion of system 10 is shown. More specifically, mold 18 is shown spaced-apart from surface 38 of substrate 12 a first distance '$d_1$'. Distance '$d_1$' may be on the order of hundreds of microns, i.e., approximately 200 to 300 microns. Walls 50 of system 10 are shown placed in a first position spaced-apart a distance '$d_2$' from surface 38 of substrate 12. Distance '$d_2$' may be on the order of tens of microns, i.e., approximately 50 microns.

Pump system 46 may introduce fluid 54 into atmosphere 56 through throughways 48 and conduits 44a and 44b. Fluid 54 may comprise a gas selected from a group of gases including, but not limited to, helium, hydrogen, nitrogen, carbon dioxide, and xenon. Fluid 54 may be introduced into atmosphere 56 through conduits 44a and 44b employing any desired method. For example, fluid 54 may be introduced through both conduits 44a and 44b concurrently, or sequentially pulsed through the same, i.e., first fluid is introduced through conduit 44a and subsequently through conduit 44b and then again through conduit 44b, with the process being repeated for a desired time or during the entire imprinting process. Methods for introduction/evacuation of fluid 54 through conduits 44a and 44b is disclosed in U.S. patent application publication 2005/0072755 filed as U.S. patent application Ser. No. 10/677,639 entitled "Single Phase Fluid Imprint Lithography Method," which is incorporated by reference herein in its entirety. In an example, conduits 44a and 44b may introduce fluid 54 within atmosphere 56 at a flow rate of 9 liters/minute.

To that end, it may be desired to control atmosphere 56, and more specifically, it may be desired to maintain fluid 54 within atmosphere 56 preceding to and until contact between mold 18 and polymerizable material 28 in droplets 30. In a further embodiment, it may be desired to maintain fluid 54 within atmosphere 56 prior to and subsequent to contact between mold 18 and polymerizable material 28 in droplets 30. In an example, it may be desired to have atmosphere 56 comprise more than a 95% mass fraction of fluid 54 therein. To that end, walls 50 facilitate control of atmosphere 56 by creating a flow resistance between first and second regions 58 and 60 of substrate 12. More specifically, as mentioned above, walls 50 are spaced-apart a distance '$d_2$' from surface 38 of substrate 12; and mold 18, in superimposition with polymerizable material 28 in droplets 30, is spaced-apart a distance '$d_1$' from surface 38 of substrate 12. Further, distance '$d_1$' is substantially greater than distance '$d_2$'. As a result, a greater resistance to a flow of fluid 54 is established between walls 50 and surface 38 of substrate 12 than between mold 18 and surface 38 of substrate 12; and thus, fluid 54 may tend to be maintained within atmosphere 56, which may be desired. For a given flow rate of fluid 54 through conduits 44a and 44b and a given volume of atmosphere 56, the distance '$d_2$' may be selected to achieve a desired resistance to the flow of fluid 54 between first and second regions 58 and 60 of substrate 12.

However, as mentioned above, a desired volume is defined between mold 18 and substrate 12 that is filled by polymerizable material 28 in droplets 30. More specifically, imprint head 26 may position mold 18 such that polymerizable material 28 in droplets 30 are in contact therewith. As a result, walls 50 may translate to minimize a probability of the same contacting substrate 12 during a decrease in a magnitude of distance '$d_1$', and more specifically, during contact of mold 18 with polymerizable material 28 in droplets 30. Contact of substrate 12 by walls 50 may result in, inter alia, structural comprise of system 10, impedance of contact between mold 18 and droplets 30, misalignment of mold 18 with respect to substrate 12, and damage to substrate 12 and/or mold 18, all of which are undesirable.

Figure 3:
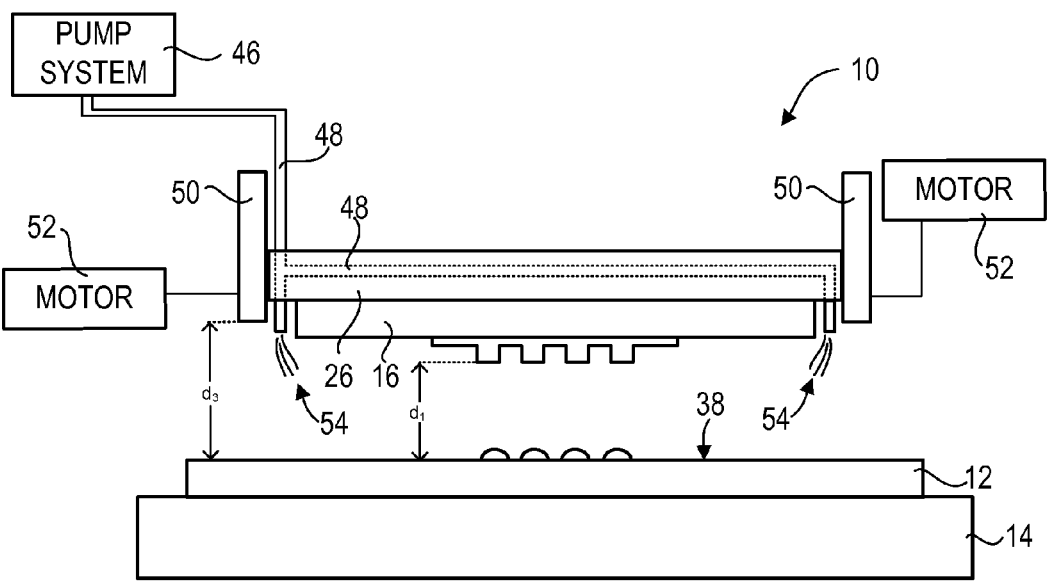
FIG. 3 is a side view of a portion of the system shown in FIG. 1, with the walls placed in a second position.

Referring to FIG. 3, to that end, walls 50 may translate in a first direction away from substrate 12. More specifically, motor 52 may position walls 50 such that the same are positioned a distance '$d_3$' from surface 38 of substrate 12, with distance '$d_3$' being greater than distance '$d_1$'. Distance '$d_3$' may be on the order of hundreds of microns.

Figure 4:
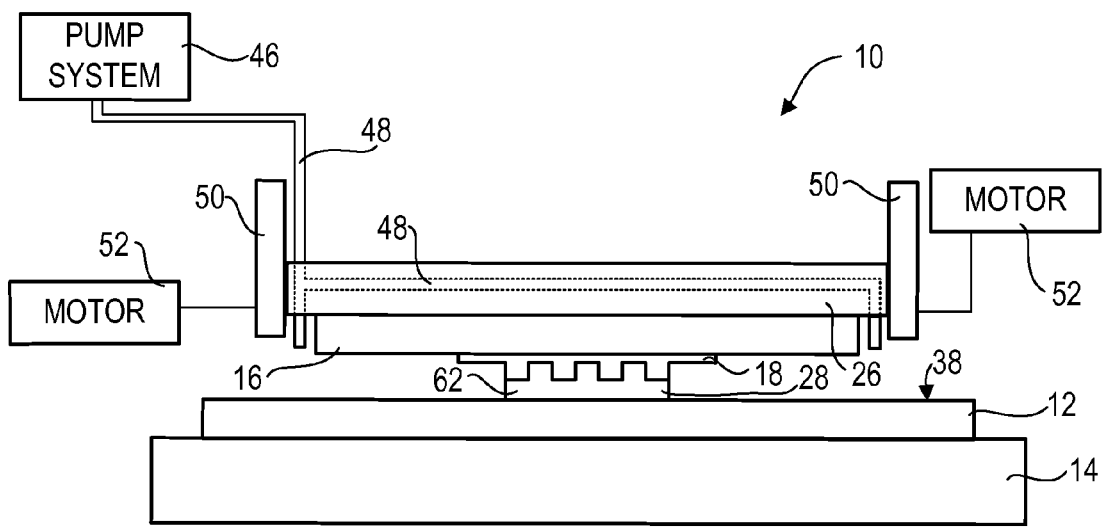
FIG. 4 is a side view of a portion of the lithographic system shown in FIG. 1, with a template in contact with a material on a substrate.

Referring to FIG. 4, mold 18 is shown in mechanical contact with polymerizable material 28, spreading droplets 30, shown in FIG. 1, so as to generate a contiguous formation 62 of polymerizable material 28 over surface 38 of substrate 12. Template 16, and further, mold 18, may translate in a second direction towards substrate 12, with the second direction being opposite to the aforementioned first direction. In a further embodiment, stage 14, and further, substrate 12 may translate in a third direction towards mold 18, with the third direction being in a direction substantially the same as the first direction. Furthermore, walls 50 may translate in the first direction concurrently or asynchronously with translation of mold 18 and/or substrate 12.

Referring to FIG. 1, in a preferred embodiment, fluid 54 may be introduced into atmosphere 56 at any time prior to contact between mold 18 and droplets 30. However, in a further embodiment, introduction of fluid 54 into atmosphere 56 may be ceased at any time.

Figure 5:
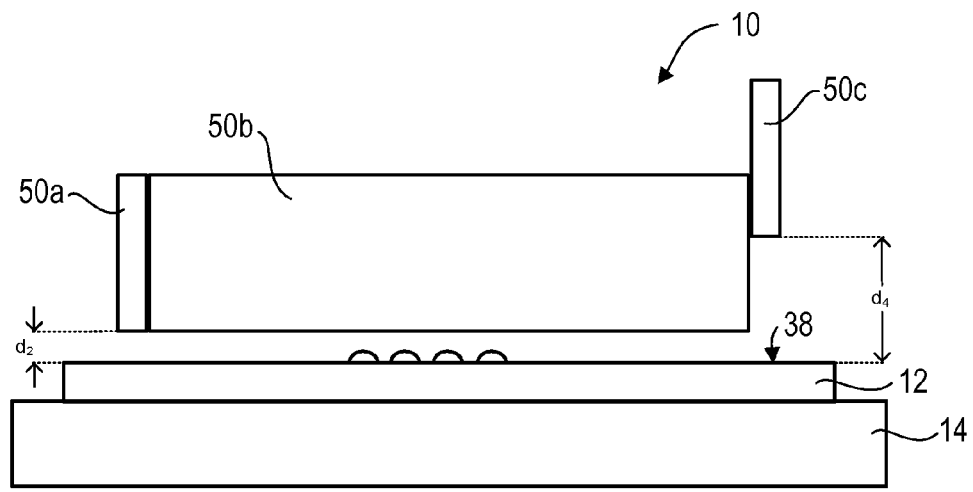
FIG. 5 is a side view of a portion of the lithographic system shown in FIG. 1, with the walls being positioned to expose a portion of an atmosphere between a template and a substrate to an ambient environment.

Referring to FIG. 5, in a preferred embodiment, it may be desired to expose a portion of atmosphere 56, shown in FIG. 1, to an ambient environment to facilitate control of fluid 54 within atmosphere 56, shown in FIG. 1. To that end, walls 50a and 50b may be positioned distance '$d_2$' from surface 38 of substrate 12, as mentioned above. However, wall 50c may be positioned a distance '$d_4$' from surface 38 of substrate 12. Distance '$d_4$' may have a magnitude approximately between 200 microns and 1 millimeter. As a result, atmosphere 56 may be exposed to an ambient environment. In a further embodiment, walls 50 may substantially surround imprint head 26, and thus atmosphere 56, forming a chamber (not shown). The chamber (not shown) may be completely evacuated or pressurized.

Referring to FIG. 2, in a further embodiment, to increase a quantity of fluid 54 disposed within atmosphere 56, distance '$d_1$' may be increased prior to contact of mold 18 with droplets 30. More specifically, distance '$d_1$' may be on the order of millimeters, i.e., approximately 1 millimeter.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A system to control an atmosphere about a substrate, the system comprising:
   a template having a mold spaced-apart a distance from a surface of the substrate;
   a supply of fluid coupled to introduce a flow between the mold and the substrate;
   a substrate chuck supporting the substrate; and
   a wall coupled to the substrate chuck to create a resistance of the flow between first and second regions of the substrate, with a position of the wall being varied in response to a decrease in a magnitude of the distance.

2. The system as recited in claim 1 further including a plurality of walls coupled to the substrate chuck.

3. The system as recited in claim 1 wherein the supply of fluid further includes a conduit to introduce the fluid between the mold and the substrate.

4. The system as recited in claim 1 wherein the supply of fluid further includes a plurality of conduits at differing locations to introduce the fluid between the mold and the substrate.

5. The system as recited in claim 1 wherein the fluid is selected from a group of gases including helium, hydrogen, nitrogen, carbon dioxide, and xenon.

6. The system as recited in claim 3 further including a pump system in fluid communication with the conduit.

7. The system as recited in claim 1 further including a motor in communication with the wall, with the motor being a solenoid selected from a group of solenoids comprising electric, pneumatic, and hydraulic.

8. A system to control an atmosphere about a substrate, the system comprising:
   a template having a mold spaced-apart a distance from a surface of the substrate;
   a supply of fluid coupled to introduce a flow between the mold and the substrate;
   a substrate chuck supporting the substrate; and
   a wall coupled to the substrate chuck to create a resistance of the flow between first and second regions of the substrate, with a position of the wall being varied to minimize a probability of contact between the wall and the template when a magnitude of the distance is decreased.

9. The system as recited in claim 8 further including a plurality of walls coupled to the substrate chuck.

10. The system as recited in claim 8 wherein the supply of fluid further includes a conduit to introduce the fluid between the mold and the substrate.

11. The system as recited in claim 8 wherein the supply of fluid further includes a plurality of conduits at differing locations to introduce the fluid between the mold and the substrate.

12. The system as recited in claim 11 further including a pump system in fluid communication with the conduit.

13. The system as recited in claim 8 wherein the fluid is selected from a group of gases including helium, hydrogen, nitrogen, carbon dioxide, and xenon.

14. The system as recited in claim 8 further including a motor in communication with the wall, with the motor being a solenoid selected from a group of solenoids comprising electric, pneumatic, and hydraulic.

15. A system to control an atmosphere about a substrate, the system comprising:
   a template having a mold spaced-apart from a surface of the substrate a first distance;
   a conduit in fluid communication with a pump system coupled to introduce a flow between the mold and the substrate;
   a substrate chuck supporting the substrate; and
   a wall coupled to the substrate chuck to create a resistance to the flow between first and second regions of the substrate to control the atmosphere about the first region, the wall positioned at a second distance, wherein the first distance is substantially greater than the second distance.

16. The system of claim 15, wherein the second distance is between approximately 10 μm-100 μm.

17. The system as recited in claim 15, further including a plurality of walls coupled to the substrate chuck.

18. The system as recited in claim 15, further including a plurality of conduits at differing locations.

19. The system as recited in claim 15, wherein the fluid is selected from a group of gases including helium, hydrogen, nitrogen, carbon dioxide, and xenon.

20. The system as recited in claim 15, further including a motor in communication with the wall, with the motor being a solenoid selected from a group of solenoids comprising electric, pneumatic, and hydraulic.

* * * * *